US008164863B2

(12) United States Patent
Lin (10) Patent No.: US 8,164,863 B2
(45) Date of Patent: Apr. 24, 2012

(54) CURRENT-PERPENDICULAR-TO-PLANE (CPP) READ SENSOR WITH MULTIPLE FERROMAGNETIC SENSE LAYERS

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1064 days.

(21) Appl. No.: 12/056,195

(22) Filed: Mar. 26, 2008

(65) Prior Publication Data

US 2009/0244791 A1 Oct. 1, 2009

(51) Int. Cl.
*G11B 5/39* (2006.01)
(52) U.S. Cl. .................. 360/324.12; 360/324.2
(58) Field of Classification Search ........ 360/324–324.2
See application file for complete search history.

(56) References Cited

U.S. PATENT DOCUMENTS

| | | | |
|---|---|---|---|
| 6,166,948 A | 12/2000 | Parkin et al. ............ 365/173 |
| 6,469,879 B1 | 10/2002 | Redon et al. ............ 360/324.2 |
| 6,519,124 B1 | 2/2003 | Redon et al. ............ 360/324.2 |
| 6,529,353 B2 | 3/2003 | Shimazawa ............. 360/324.2 |
| 6,731,477 B2 * | 5/2004 | Lin et al. ................ 360/324.1 |
| 6,818,458 B1 | 11/2004 | Gill ......................... 438/3 |
| 7,116,532 B2 | 10/2006 | Carey et al. ............. 360/324.11 |
| 7,177,122 B2 | 2/2007 | Hou et al. ................ 360/324.12 |
| 7,236,336 B2 | 6/2007 | Gill ........................ 360/324.12 |
| 7,751,156 B2 * | 7/2010 | Mauri et al. ............. 360/324.2 |
| 7,830,641 B2 * | 11/2010 | Lin ......................... 360/324.2 |
| 2002/0048127 A1 * | 4/2002 | Fukuzawa et al. ....... 360/324.1 |
| 2006/0056114 A1 | 3/2006 | Fukumoto et al. ....... 360/324.2 |
| 2007/0047159 A1 | 3/2007 | Zhao et al. .............. 360/324.12 |
| 2007/0097560 A1 | 5/2007 | Karr et al. ............... 360/324.2 |
| 2007/0111332 A1 | 5/2007 | Zhao et al. .............. 438/3 |
| 2008/0062582 A1 * | 3/2008 | Komagaki ............... 360/324.11 |
| 2008/0080101 A1 * | 4/2008 | Mauri et al. ............. 360/324.2 |
| 2008/0080102 A1 * | 4/2008 | Ibusuki et al. ........... 360/324.2 |
| 2008/0112093 A1 * | 5/2008 | Sato et al. ............... 360/324.2 |
| 2008/0123224 A1 * | 5/2008 | Akie ....................... 360/324.11 |
| 2008/0124581 A1 * | 5/2008 | Miura et al. ............. 428/811.1 |
| 2008/0259507 A1 * | 10/2008 | Lin ......................... 360/324.1 |
| 2009/0086384 A1 * | 4/2009 | Hirata et al. ............. 360/324.2 |

OTHER PUBLICATIONS

Li et al., "Thermal stability of Ir-Mn/Co-Fe-B/Al-O/Co-Fe-B tunnel junctions" Received May 31, 2005; accepted Oct. 18, 2005; published online Dec. 12, 2005.

(Continued)

*Primary Examiner* — Will J Klimowicz
(74) *Attorney, Agent, or Firm* — Zilka-Kotab, PC (57) ABSTRACT

The invention provides a current-perpendicular-to-plane (CPP) tunneling magnetoresistance (TMR) or giant magnetoresistance (GMR) read sensor with multiple ferromagnetic sense layers. In one embodiment of the invention, a CPP TMR read sensor comprises a first sense layer formed by a ferromagnetic polycrystalline Co—Fe film, a second sense layer formed by a ferromagnetic interstitial-type amorphous Co—Fe—B film, a third sense layer formed by a ferromagnetic substitute-type amorphous Co—Fe—X film where X is Hf, Zr or Y, and a fourth sense layer formed by a ferromagnetic Ni—Fe film. The third sense layer acts as a diffusion barrier layer to suppress Ni diffusion, thus allowing the incorporation of the Ni—Fe fourth sense layer for improving ferromagnetic properties of the multiple sense layers. The multiple sense layers induce spin-dependent scattering, thus facilitating the CPP TMR read sensor to exhibit a strong TMR effect.

16 Claims, 11 Drawing Sheets

OTHER PUBLICATIONS

Lin et al., "A tunneling magnetoresistance sensor overlaid with a longitudinal bias stack in a read region" Magnetics Conference, 2002. INTERMAG Europe 2002. Digest of Technical Papers. 2002 IEEE International, Volume Issue, Apr. 28-May 2, 2002 p. CA5.

Hwanga et al., "Magnetoresistance and switching properties of magnetic tunnel junctions using amorphous CoSiB free layer" Available online Nov. 17, 2006.

Saito et al., "Thermal stability parameters in synthetic antiferromagnetic free layers in magnetic tunnel junctions" Published online May 5, 2005.

Choi et al., "Thermal stability of magnetic tunnel junctions with new amorphous ZrAl-alloy Films as under and capping layers" Magnetics, IEEE Transactions on, Publication Date: Oct. 2005, vol. 41, Issue: 10.

* cited by examiner

| Property | Co-Fe | Co-Fe-B | Co-Fe-Hf | Ni-Fe |
|---|---|---|---|---|
| $M_S$ (memu/cm$^3$) | 1,506 | 822 | 757 | 639 |
| $H_C$ (Oe) | 22.6 | 1.8 | 4.3 | 2.2 |
| $H_F$ (Oc) | 86.7 | 53.6 | 47.9 | 41.1 |
| $\lambda_S$ ($\times 10^{-6}$) | 1.25 | 0.70 | 5.97 | -8.92 |

FIG. 11

CURRENT-PERPENDICULAR-TO-PLANE (CPP) READ SENSOR WITH MULTIPLE FERROMAGNETIC SENSE LAYERS

FIELD OF THE INVENTION

The invention relates to a current-perpendicular-to-plane (CPP) tunneling magnetoresistance (TMR) or giant magnetoresistance (GMR) read sensor, and more particularly to a CPP TMR or GMR read sensor with multiple ferromagnetic sense layers.

BACKGROUND OF THE INVENTION

The heart of a computer is a non-volatile magnetic storage device that is referred to as a hard disk drive. The hard disk drive includes a hard disk and an assembly of write and read heads. The assembly of write and read heads is supported by a slider that is suspended by a suspension arm. When the hard disk rotates, an actuator swings the suspension arm to place the assembly of write and read heads over selected circular data tracks on the surface of the hard disk. The suspension arm biases the slider toward the surface of the hard disk, and an air bearing generated by the rotation of the hard disk causes the slider to fly on the air bearing at a very low elevation (fly height) over the surface of the hard disk. When the slider rides on the air bearing, the write and read heads write data to and read data from, respectively, the circular data tracks on the surface of the hard disk. Processing circuitry connected to the write and read heads then operates according to a computer program to implement writing and reading functions.

In a reading process, the read head passes over magnetic transitions of a data track on the surface of the hard disk, and magnetic fields emitting from the magnetic transitions modulate the resistance of a read sensor in the read head. Changes in the resistance of the read sensor are detected by a sense current passing through the read sensor, and are then converted into voltage changes that generate read signals. The resulting read signals are used to decode data encoded in the magnetic transitions of the data track.

In a typical read head, a current-perpendicular-to-plane (CPP) tunneling magnetoresistance (TMR) or giant magnetoresistance (GMR) read sensor is electrically separated by side oxide layers from longitudinal bias layers in two side regions to prevent a sense current from shunting into the two side regions, but is electrically connected with lower and upper shields to allow the sense current to flow in a direction perpendicular to the sensor plane. A typical CPP TMR read sensor comprises an electrically insulating barrier layer sandwiched between lower and upper sensor stacks. The barrier layer is formed by a nonmagnetic oxygen-doped Mg (Mg—O) or Mg oxide ($MgO_X$). When the sense current quantum-jumps across the Mg—O or $MgO_X$ barrier layer, a TMR effect causes a change in the resistance of the CPP TMR read sensor. The strength of this TMR effect is typically characterized by a ratio of a TMR coefficient ($\Delta R_T/R_J$) divided by a product of junction resistance and area ($R_J A_J$), where $\Delta R_T$ is a maximal resistance change caused by the TMR effect, $R_J$ is a junction resistance, and $A_J$ is a junction area. A typical CPP GMR read sensor comprises an electrically conducting spacer layer sandwiched between the lower and upper sensor stacks. The spacer layer is formed by a nonmagnetic Cu or oxygen-doped Cu (Cu—O) film. When the sense current flows across the Cu or Cu—O spacer layer, a GMR effect causes a change in the resistance of the CPP GMR read sensor. The strength of this GMR effect is typically characterized by a GMR coefficient ($\Delta R_G/R_{Min}$), where $\Delta R_G$ is a maximal resistance change caused by the GMR effect, and $R_{Min}$ is a minimal resistance of the CPP GMR read sensor.

A typical lower sensor stack can comprise a first seed layer formed of a Ta film, a second seed layer formed of a nonmagnetic Ru film, a pinning layer formed of a antiferromagnetic Ir—Mn film a keeper layer formed by a ferromagnetic Co—Fe film, an antiparallel coupling layer formed of a Ru film, and a reference layer formed of a ferromagnetic Co—Fe—B film. The keeper layer, the antiparallel-coupling layer, and the reference layer form a flux-closure structure where four fields are induced. First, a unidirectional anisotropy field ($H_{UA}$) is induced by exchange coupling between the antiferromagnetic pinning layer and the keeper layer. Second, an antiparallel-coupling field ($H_{APC}$) is induced by antiparallel coupling between the keeper layer and the reference layer and across the antiparallel-coupling layer. Third, a demagnetizing field ($H_D$) is induced by the net magnetization of the keeper layer and the reference layer. Fourth, a ferromagnetic-coupling field ($H_F$) is induced by ferromagnetic coupling between the reference layer and the sense layers and across the barrier or spacer layer. To ensure proper sensor operation, $H_{UA}$ and $H_{APC}$ must be high enough to rigidly pin magnetizations of the keeper layer and the reference layer in opposite transverse directions perpendicular to an air bearing surface (ABS), while $H_D$ and $H_F$ must be small and balance with each other to orient the magnetization of the sense layers in a longitudinal direction parallel to the ABS.

An upper sensor stack can comprise a first sense layer formed of a ferromagnetic Co—Fe film, a second sense layer formed of a ferromagnetic Co—Fe—B film, and a cap layer such as a Ru film. The total magnetic moment of the Co—Fe first sense layer and the Co—Fe—B second sense layer is equivalent to the magnetic moment of a 4.5 nm thick ferromagnetic Ni—Fe film without moment losses at interfaces. The Co—Fe first sense layer acts as a buffer layer to prevent the Co—Fe—B second sense layer from B segregations at an interface between the barrier layer and the sense layers, thus facilitating the Co—Fe—B second sense layer to exhibit a strong TMR effect after annealing. The Co—Fe—B second sense layer exhibits an interstitial-type amorphous structure after its deposition, which transfers into a polycrystalline structure after annealing, thereby exhibiting the strong TMR effect. To attain the interstitial-type amorphous structure, its B content must be high enough for B atoms, which are much smaller than Co and Fe atoms, to occupy interstitial sites of a crystalline structure and thus interfere with the ability of the Co and Fe atoms to crystallize.

It should be noted that the sense layers do not comprise a ferromagnetic Ni—Fe (permalloy) film at all, which has conventionally formed at least part of sense layers of anisotropic and giant magnetoresistance sensors for more than thirty years due to its very soft ferromagnetic properties, such as a low easy-axis coercivity ($H_{CE}$), a low hard-axis coercivity ($H_{CH}$), a low anisotropy field ($H_K$), as well as its negative saturation magnetostriction ($\lambda_S$). The use of Ni—Fe a sense layer has been prohibited since its direct contact with the Co—Fe or Co—Fe—B sense layer causes diffusion and substantially deteriorates the TMR effect. In spite of the fact that the Co—Fe first sense layer and the Co—Fe—B second sense layer exhibit non-satisfactory ferromagnetic properties and positive $\lambda_S$, they still facilitate the CPP TMR read sensor to exhibit a TMR effect.

SUMMARY OF THE INVENTION

The invention provides a current-perpendicular-to-plane (CPP) tunneling magnetoresistance (TMR) or giant magnetoresistance (GMR) read sensor with multiple ferromagnetic sense layers. In one embodiment of the invention, a CPP TMR read sensor comprises a first sense layer formed by a ferromagnetic polycrystalline Co—Fe film, a second sense layer formed by a ferromagnetic interstitial-type amorphous Co—Fe—B film, a third sense layer formed by a ferromagnetic substitute-type amorphous Co—Fe—X film where X is Hf, Zr or Y, and a fourth sense layer formed by a ferromagnetic Ni—Fe film. The third sense layer acts as a diffusion barrier layer to suppress Ni diffusion, thus allowing the incorporation of the Ni—Fe fourth sense layer for improving ferromagnetic properties of the multiple sense layers. The multiple sense layers induce spin-dependent scattering, thus facilitating the CPP TMR read sensor to exhibit a strong TMR effect.

These and other advantages and features of the invention will be apparent upon reading the following detailed description in conjunction with the Figures.

BRIEF DESCRIPTION OF THE DRAWINGS

For a fuller understanding of the nature and advantages of the invention, as well as the preferred mode of use, reference should be made to the following detailed description read in conjunction with the accompanying drawings that are not to scale.

DETAILED DESCRIPTION OF THE INVENTION

The following describes various embodiments presently contemplated for carrying out the invention. This description is made for the purpose of illustrating the general principles of the invention and is not meant to limit the inventive concepts claimed herein.

Figure 1:
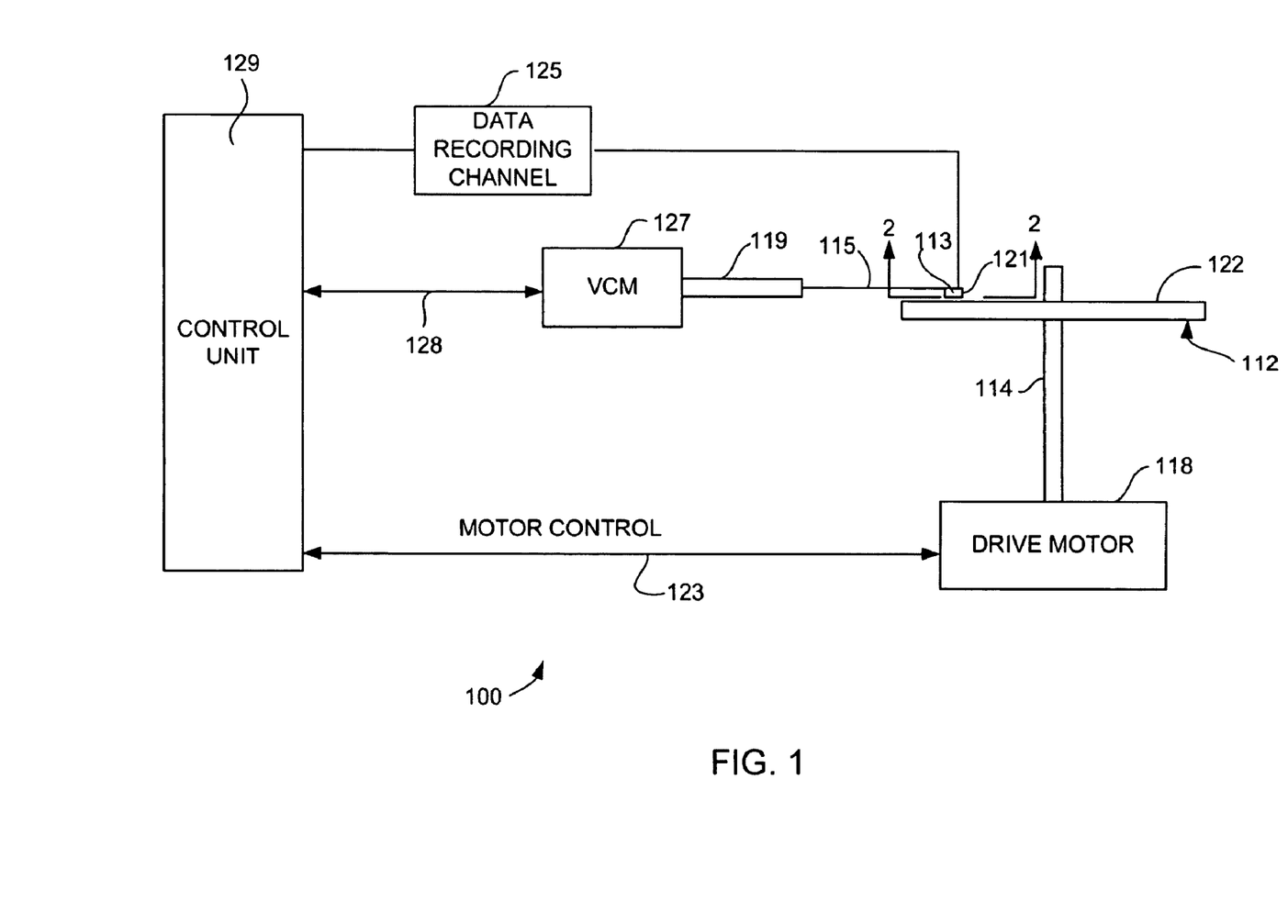
FIG. 1 is a schematic illustration of a hard disk drive in which the invention can be embodied.

Referring now to FIG. 1, there is shown a hard disk drive 100 embodying the invention. As shown in FIG. 1, at least one hard disk 112 is supported on a spindle 114 and rotated by a disk drive motor 118.

An assembly of write and read heads 121 is supported by a slider 113 that is mounted on a suspension arm 115. In a quiescent state, the hard disk 112 is stationary, and the suspension arm 115 provides a slight spring force, which biases the slider 113 against the recording medium 122 formed on the surface of the hard disk 112. During operation of the hard disk drive 100, the hard disk 112 rotates, and an actuator 119 swings the suspension arm 115 to place the slider 113 radially in and out over the recording medium 122. The rotation of the hard disk 112 generates an air bearing between the slider 113 and the recording medium 122, which exerts an upward force or lift on the slider 113. The air bearing thus counter-balances the slight spring force of the suspension arm 115 and supports the slider 113 off and slightly above the recording medium 122 by a small, substantially constant fly height. As the slider flies on the air bearing, the assembly of write and read heads 121 may access different concentric data tracks in the recording medium 122. The write and read heads thus write data to and read data from, respectively, the recording medium 122.

The actuator 119 is attached to a voice coil motor (VCM) 127. The VCM 127 comprises a coil movable within a fixed magnetic field, the direction and speed of the coil movements being controlled by motor current signals generated by a control unit 129.

Various components of the hard disk drive 100 are controlled by control signals also generated by the control unit 129, which typically comprises logic control circuits, storage means and a microprocessor. The control unit 129 generates control signals to control various system operations such as drive motor control signals on line 123, and head position and seek control signals on line 128. The control signals on line 128 provide desired current profiles to optimally move and position the slider 113 to the desired data track in the recording medium 122. Write and read signals are communicated to and from the assembly of write and read heads 121, respectively, by way of a recording channel 125.

Figure 2:
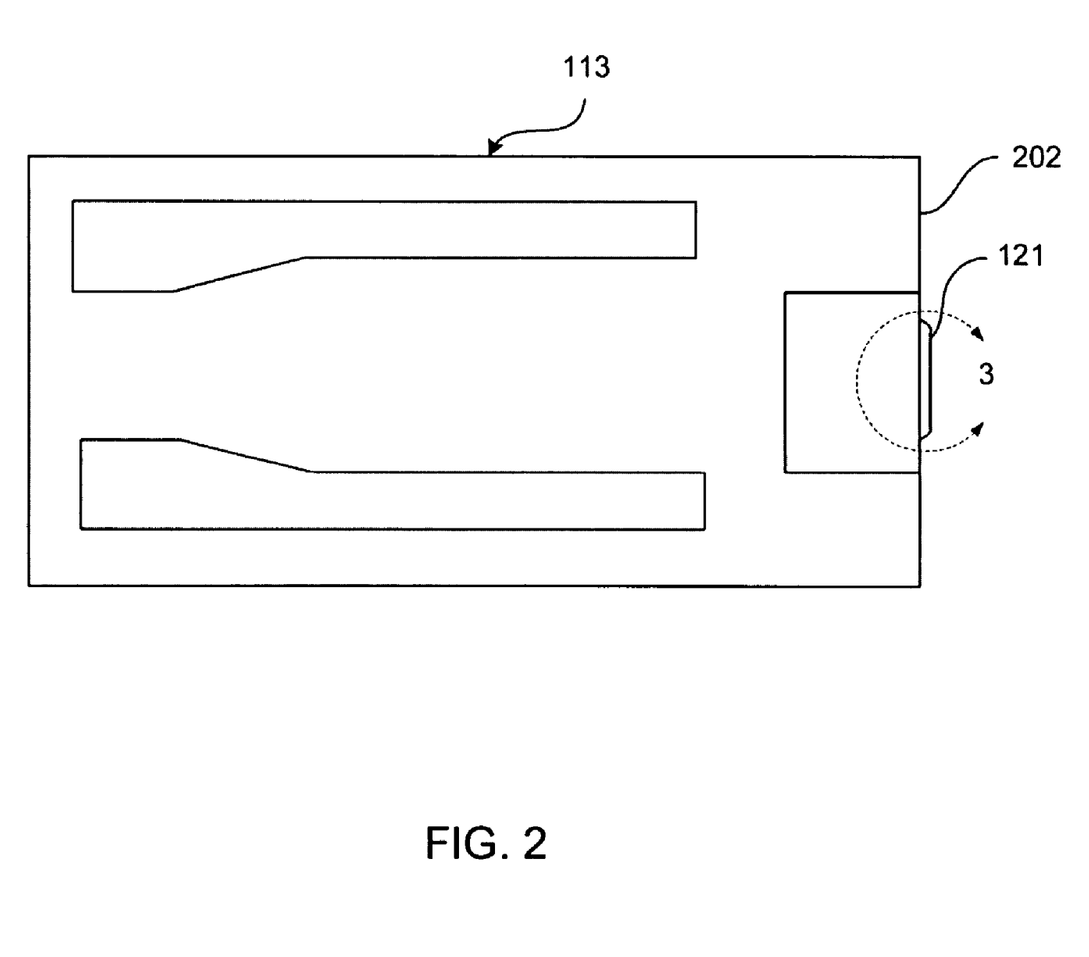
FIG. 2 is an ABS view of a slider, taken from line 2-2 of FIG. 1, illustrating the location of an assembly of write and read heads thereon.

With reference to FIG. 2, the orientation of the assembly of write and read heads 121 on the slider 113 can be seen in more detail. FIG. 2 is an ABS view of the slider 113, and as can be seen, the assembly of write and read heads 121, is located at a trailing edge 202 of the slider 113. The above description of a typical hard disk drive, and the accompanying illustration of FIGS. 1 and 2 are for representation purposes only. It should be apparent that hard disk drives may contain a large number of hard disks and actuators, and each actuator may support a number of sliders.

Figure 3:
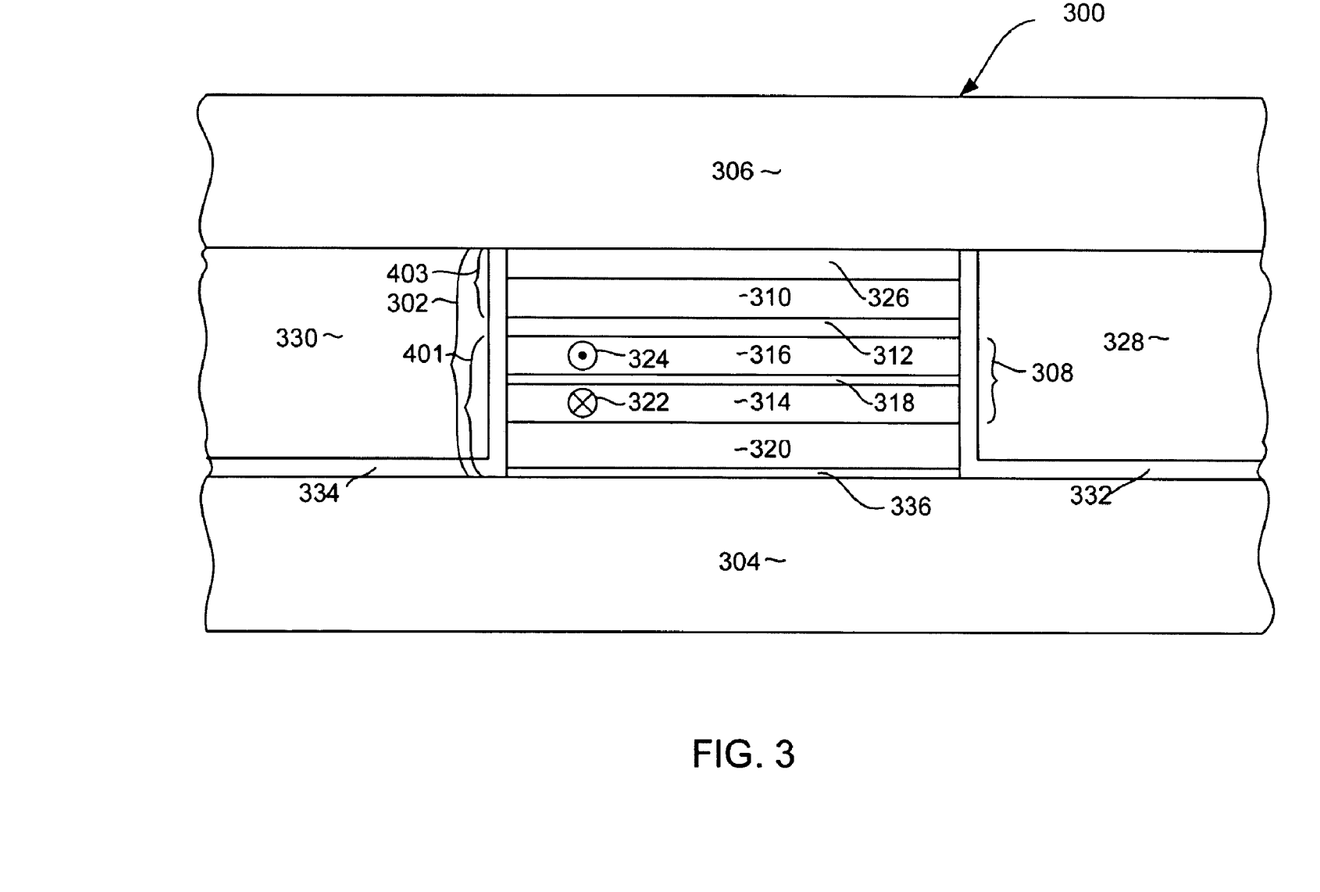
FIG. 3 is an ABS view of a typical read head fabricated on a slider.

FIG. 3 shows an ABS view of a typical read head 300 fabricated on the slider 113. The read head 300 includes a lower shield 304 and an upper shield 306 that sandwich a TMR read sensor 302. The read head 300 also has two side regions at edges of the TMR read sensor 302. In the two side regions, side oxide layers 332, 334 separate longitudinal bias layers 328, 330, respectively, from the lower shield 304 and the CPP TMR read sensor 302.

The TMR read sensor 302 comprises an electrically insulating barrier layer 312 sandwiched between a lower sensor stack 401 and an upper sensor stack 403. The lower sensor stack 401 comprises one or more nonmagnetic seed layers 336, an antiferromagnetic pinning layer 320, a ferromagnetic keeper layer 314, a nonmagnetic antiparallel-coupling layer 318, and a ferromagnetic reference layer 316. The upper sensor stack 403 comprises one or more ferromagnetic sense layers 310 and a nonmagnetic cap layer 326.

The ferromagnetic keeper layer 314, the nonmagnetic antiparallel-coupling layer 318, and the ferromagnetic reference layer 316 form a flux-closure structure 308. Exchange coupling occurs between the antiferromagnetic pinning layer 320 and the ferromagnetic keeper layer 314, thereby strongly pinning the magnetization 322 of the ferromagnetic keeper layer 314 in a direction 322 perpendicular to and away from the ABS. Antiparallel coupling occurs between the ferromagnetic keeper layer 314 and the ferromagnetic reference layer 316 and across the nonmagnetic antiparallel-coupling layer 318, thereby pinning the magnetization of the ferromagnetic reference layer 316 in an opposite direction 324 perpendicular to but towards the ABS.

Figure 4:
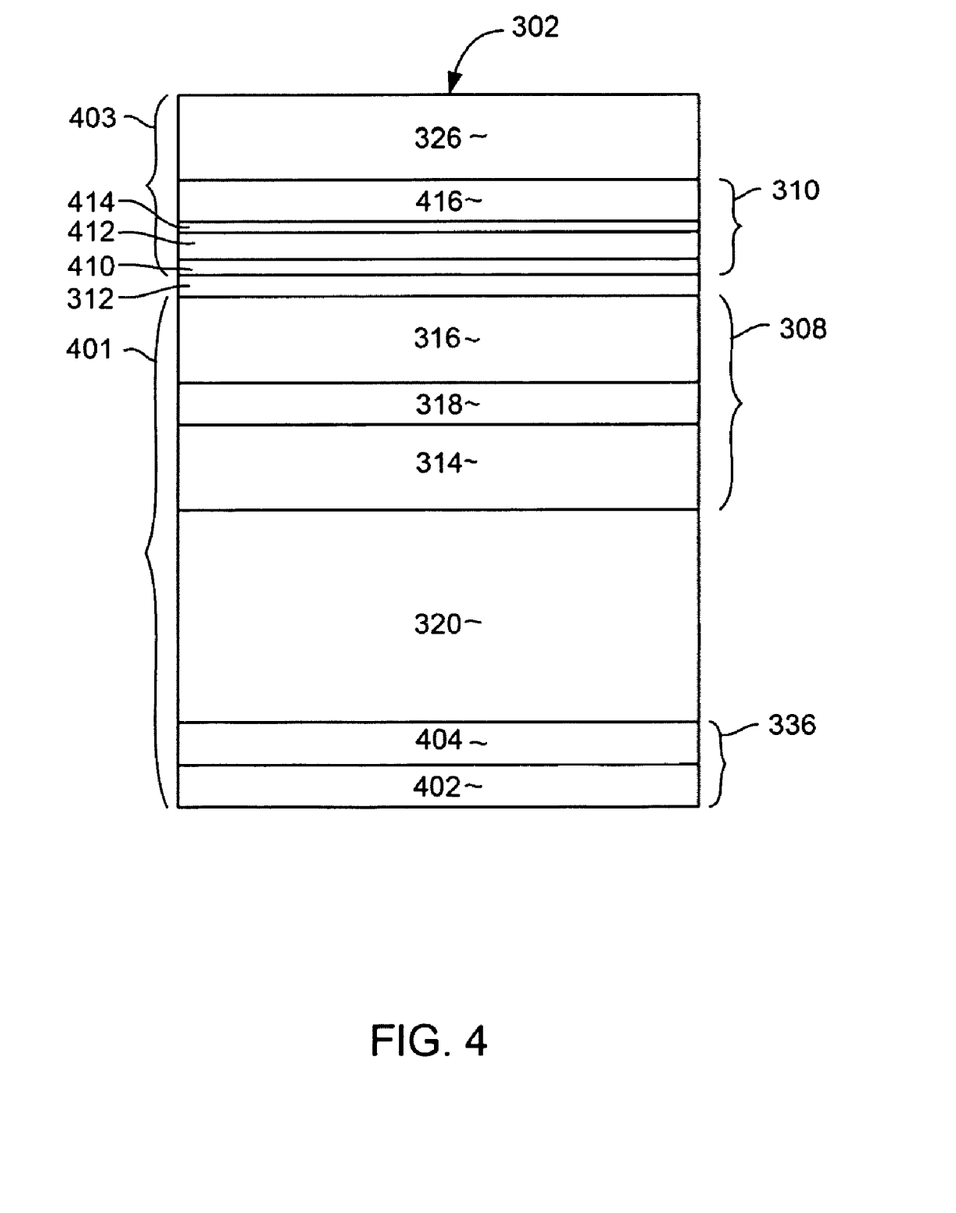
FIG. 4 is an ABS view of a TMR read sensor according to an embodiment of the invention.

FIG. 4 shows an ABS view of a TMR read sensor 302 according to an embodiment of the invention. The TMR read sensor 302 comprises an electrically insulating barrier layer 312 sandwiched between the lower sensor stack 401 and the upper sensor stack 403. The barrier layer 312 may be formed by a nonmagnetic oxygen-doped Mg (Mg—O) film in-situ formed in only one module of a sputtering system, as described below. After cleaning a Mg target, a Mg film is DC-magnetron sputtered in an argon gas. A first oxygen treatment is then applied to the Mg film, resulting in oxygen doping into the Mg film. A Mg—O film is then DC-magnetron sputtered in a mixture of argon and oxygen gases. A second oxygen treatment is then applied to the Mg—O film. Another Mg film is then DC-magnetron sputtered in an argon gas. A third oxygen treatment in an oxygen gas is then applied to the Mg film. The finished barrier layer 312 preferably has a thickness of 0.4 to 2 nm. It should be pointed out that the invention could be embodied in a GMR sensor, in which case the layer 312 would be an electrically conductive spacer layer such as Cu or oxygen doped Cu (Cu—O), which could have a thickness of, for example, 1.6 to 4 nm.

The lower sensor stack 401 comprises a first seed layer 402 formed by a nonmagnetic Ta film, a second seed layer 404 formed by a nonmagnetic Ru film, a pinning layer 320 formed by a antiferromagnetic Ir—Mn film, a keeper layer 314 formed by a ferromagnetic Co—Fe film, an antiparallel coupling layer 318 formed by a nonmagnetic Ru film, and a reference layer 316 formed by a ferromagnetic Co—Fe—B film.

The upper sensor stack 403 comprises multiple ferromagnetic sense layers 310 and a cap layer 326 formed by a nonmagnetic Ru film. The multiple ferromagnetic sense layers 310 comprise a first sense layer 410 formed of a ferromagnetic Co—Fe film, a second sense layer 412 formed of an interstitial-type amorphous ferromagnetic Co—Fe—B film, a third sense layer 414 formed of a substitute-type amorphous ferromagnetic Co—Fe—X film (where X is Hf, Zr or Y), and a fourth sense layer 416 formed of a ferromagnetic Ni—Fe film. Although the element X in the third sense layer 414 can be Hf, Zr or Y, it is most preferably Hf.

The first sense 410 layer preferably has 50-90 atomic percent Co and 10-50 atomic percent Fe and preferably has a thickness of 0.8 nm or less. The second sense layer 412 preferably has 60-80 atomic percent Co, 0-40 atomic percent Fe and 4-30 atomic percent B and preferably has a thickness of 1-4 nm. The third sense layer 414 preferably has 60-80 atomic percent Co, 0-40 atomic percent Fe and 4-30 atomic percent X, and preferably has a thickness of 0.6-2 nm. The fourth sense layer 416 preferably has 80-100 atomic percent Ni, 0-20 atomic percent Fe and preferably has a thickness of 1-8 nm.

In the second sense layer 412 is formed of an interstitial-type amorphous ferromagnetic Co—Fe—B film, and its B content is high enough for B atoms, which are much smaller than Co and Fe atoms, to occupy interstitial sites of a crystalline structure and thus interfere with the ability of the Co and Fe atoms to crystallize. In the third sense layer 414, formed of a substitute-type amorphous ferromagnetic Co—Fe—Hf film, its Hf content is high enough for Hf atoms, which are much larger than Co and Fe atoms, to occupy substitute sites of a crystalline structure and thus interfere with the ability of the Co and Fe atoms to crystallize. Zr and Y atoms, which are also much larger than the Co and Fe atoms, can also be added to occupy substitute sites of a crystalline structure for the formation of the substitute-type amorphous ferromagnetic Co—Fe—Zr and Co—Fe—Y films, respectively. It has been found that in contrast to the interstitial-type amorphous film that cannot stop Ni diffusion, the substitute-type amorphous film can substantially suppress Ni diffusion, as described below.

When a sense current flows in a direction perpendicular to interfaces of the TMR read sensor 302, the TMR read sensor 302 acts as a series circuit and thus its highest-resistivity ($\rho$) layer or path dominates $R_J A_J$. Since the electrically insulating Mg—O barrier layer 312 exhibits a $\rho$ of more than $10^8$ $\mu\Omega$-cm, and all the other electrically conducting metallic layers exhibit $\rho$'s of less than 200 $\mu\Omega$-cm, the $R_J A_J$ of the TMR read sensor 302 thus mainly depends on the thickness of the Mg—O barrier layer 312 and its two interfaces, one between the reference layer 316 and the Mg—O barrier layer 312, and the other between the Mg—O barrier layer 312 and the first sense layer 410. It has been found, however, that even the Mg—O barrier layer 312 and its two interfaces remain identical, uses of various ferromagnetic films as additional sense layers cause unexpected substantial $R_J A_J$ variations, probably due to unwanted diffusion into the first sense layer 410 and the Mg—O barrier layer 312.

When the sense current quantum-jumps across the Mg—O barrier layer 312 of the TMR read sensor 302 and when a magnetic field aligns the magnetization of the sense layers 310 from the same direction as the magnetization of the reference layer 316 to an opposite direction, its resistance increases by $\Delta R_T$ due to the TMR effect. This TMR effect, characterized by $\Delta R_T/R_J$, also mainly depends on the thickness of the Mg—O barrier layer 312 and its two interfaces. It has been found, however, that even the Mg—O barrier layer 312 and its two interfaces remain identical, uses of different ferromagnetic films as additional sense layers cause unexpected substantial $\Delta R_T/R_J$ variations, probably due to spin-dependent scattering at interfaces of the multiple sense layers.

In an embodiment of the invention, by evaluating various ferromagnetic films used as sense layers based on their roles in varying $R_J A_J$ and $\Delta R_T/R_J$, ferromagnetic Co—Fe, Co—Fe—B, Co—Fe—Hf and Ni—Fe films with optimal compositions are selected as the first, second, third, fourth sense layers, 410, 412, 414, 416 of the TMR read sensor 302, respectively. The use of these multiple sense layers substantially improves the TMR effect, while still maintaining soft ferromagnetic properties of the multiple sense layers, as described below.

Figure 5:
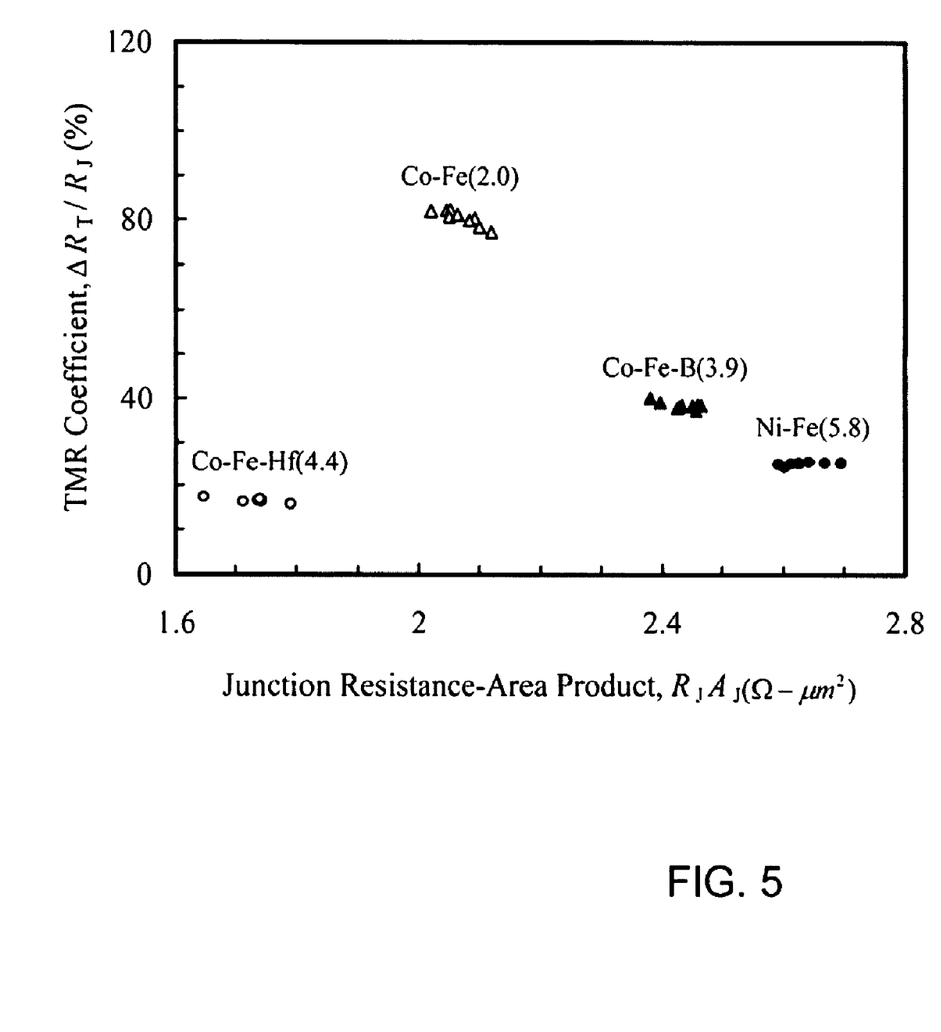
FIG. 5 is a chart showing $\Delta R_T/R_J$ versus $R_J A_J$ for non-patterned TMR read sensors with Co—Fe(2.0), Co—Fe—B (3.9), Co—Fe—Hf(4.4) and Ni—Fe(5.8) sense layers after annealing for 5 hours at 240° C.
Figure 11:
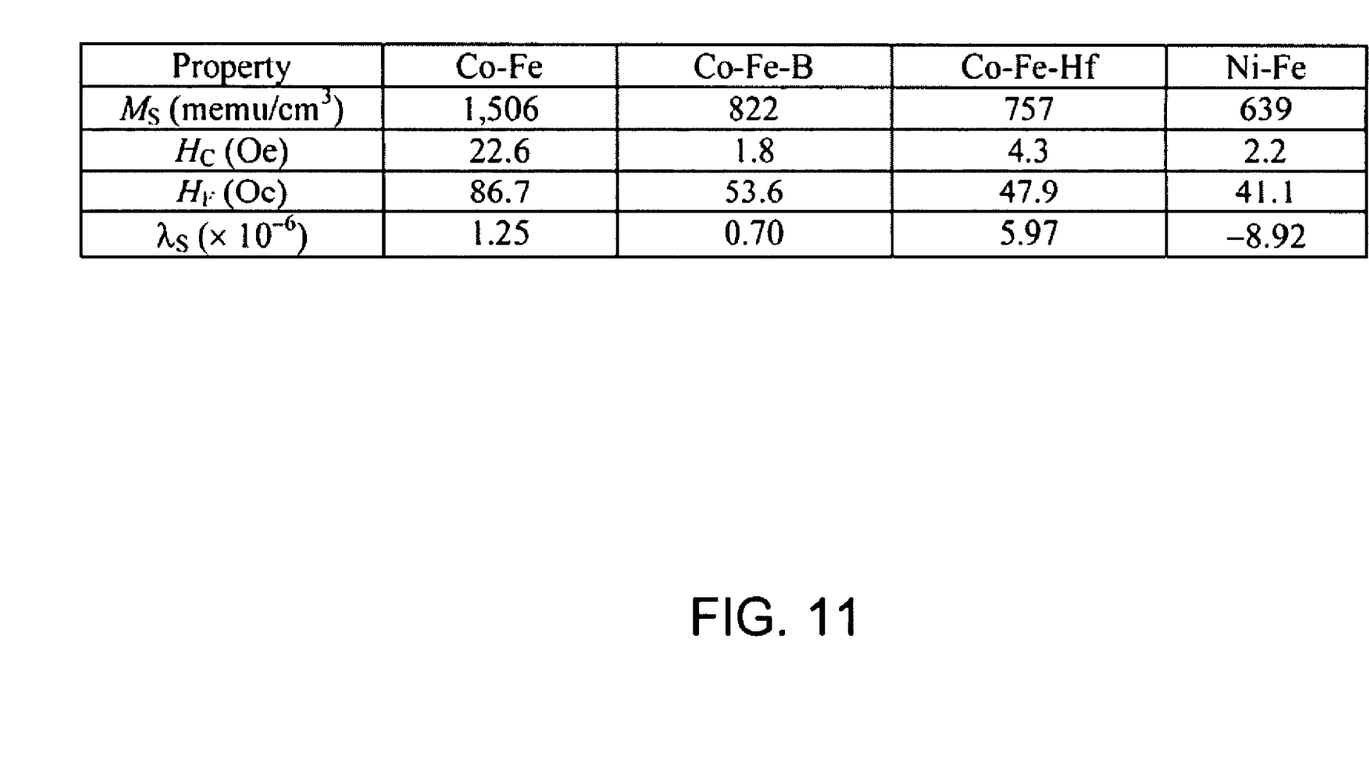
FIG. 11 is a table showing ferromagnetic properties of Co—Fe(2.0), Co—Fe—B(3.9), Co—Fe—Hf(4.4) and Ni—Fe(5.8) sense layers of TMR read sensors after annealing for 5 hours at 240° C.

TMR read sensors with Co—Fe, Co—Fe—B, Co—Fe—Hf and Ni—Fe sense layers are fabricated on lower shields that can be formed of ferromagnetic Ni—Fe films. The table shown in FIG. 11 shows ferromagnetic properties of the Co—Fe(2.0), Co—Fe—B(3.9), Co—Fe—Hf(4.4) and Ni—Fe(5.8) sense layers of the TMR read sensors. To meet a sensor design for high read sensitivity, the magnetic moment of the sense layer is controlled to be as small as 0.32 memu/cm$^2$ (equivalent to that of a 4.5 nm thick ferromagnetic 80Ni-20Fe film without moment losses at interfaces), and thus a sense layer with a lower $M_S$ requires a larger thickness. After coating with Cu(75)/Ru(12) top conducting leads, these non-patterned TMR read sensors are probed with a 12-point microprobe in a magnetic field of about 160 Oe, and measured data from any four of the microprobe are analyzed with a current-in-plane tunneling model to determine $R_J A_J$ and $\Delta R_T/R_J$. FIG. 5 shows $\Delta R_T/R_J$ versus $R_J A_J$ for these non-patterned TMR read sensors. It is surprising to find that contacts of different sense layers with an identical Mg—O barrier layer lead to substantial $R_J A_J$ variations. While the TMR read sensors with the Co—Fe—Hf and Co—Fe sense layers exhibit $R_J A_J$'s of as low as 1.7 and 2.1 Ω-μm$^2$, respectively, the TMR read sensors with the Co—Fe—B and Ni—Fe sense layers exhibit $R_J A_J$'s of as high as 2.4 and 2.6 Ω-μm$^2$, respectively. These results indicate that the Hf addition to the Co—Fe sense layer might prohibit diffusion into the Mg—O barrier layer, while the B and Ni additions might induce diffusion. On the other hand, only the TMR read sensor with the Co—Fe sense layer exhibits a very high $\Delta R_T/R_J$. Although the Co—Fe sense layer is not viable due to its very high $H_C$ and positive $\delta_S$, as shown in Table 1, it may act as a buffer layer to facilitate other sense layers to increase $\Delta R_T/R_J$, particularly including the Ni—Fe sense layer which exhibits a very low $H_C$ and a very negative $\delta_S$.

Figure 6:
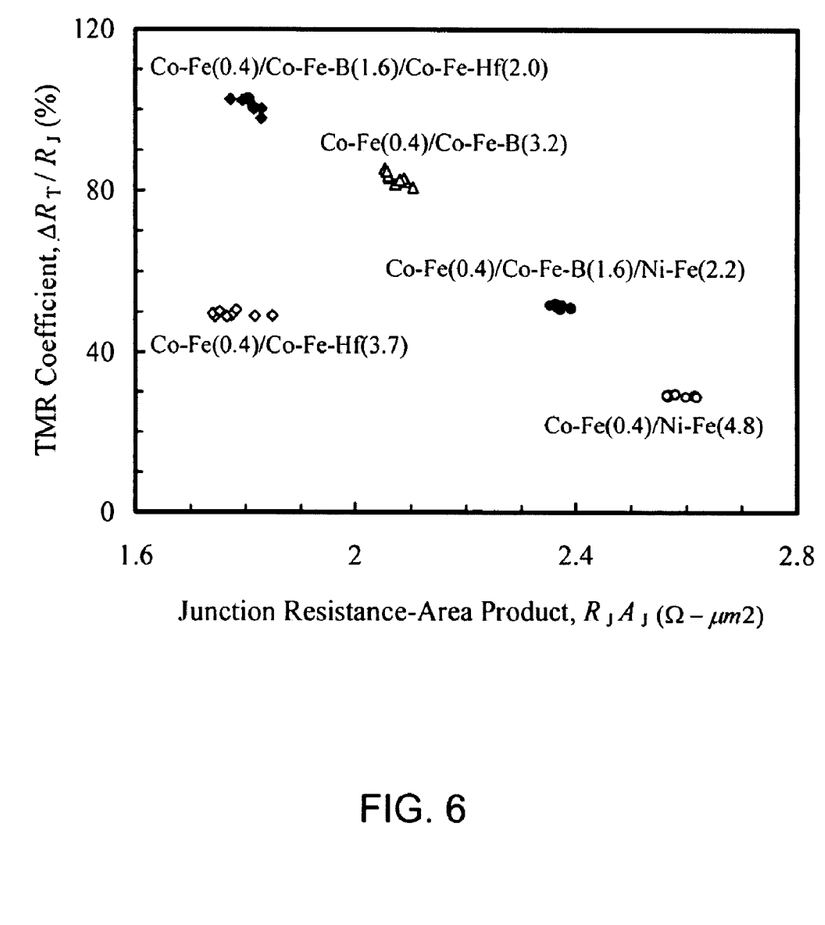
FIG. 6 is a chart showing $\Delta R_T/R_J$ versus $R_J A_J$ for non-patterned TMR read sensors with Co—Fe(0.4)/Co—Fe—B (3.2), Co—Fe(0.4)/Co—Fe—Hf(3.7), Co—Fe(0.4)/Ni—Fe (4.8), Co—Fe(0.4)/Co—Fe—B(1.6)/Co—Fe—Hf(2.0) and Co—Fe(0.4)/Co—Fe—B(1.6)/Ni—Fe(2.2) sense layers after annealing for 5 hours at 240° C.

FIG. 6 shows $\Delta R_T/R_J$ versus $R_J A_J$ for non-patterned TMR read sensors with Co—Fe(0.4)/Co—Fe—B(3.2), Co—Fe (0.4)/Co—Fe—Hf(3.7), Co—Fe(0.4)/Ni—Fe(4.8), Co—Fe (0.4)/Co—Fe—B(1.6)/Co—Fe—Hf(2.0) and Co—Fe(0.4)/Co—Fe—B(1.6)/Ni—Fe(2.2) sense layers after annealing for 5 hours at 240° C. With the Co—Fe sense layer as a buffer layer for the Co—Fe—B sense layer, $R_J A_J$ substantially decreases from 2.4 to 2.1 Ω-μm$^2$, while $\Delta R_T/R_J$ substantially increases from 38.5% to 83.0%, indicating feasibility in suppressing the B diffusion. With the Co—Fe and even Co—Fe/Co—Fe—B sense layers as buffer layers for the Ni—Fe sense layer, $R_J A_J$ still remains high while $\Delta R_T/R_J$ still remains low, indicating difficulties in suppressing the Ni diffusion. On the other hand, in spite that the Co—Fe—Hf sense layer behaves as a non-viable buffer layer as indicated by the lowest $\Delta R_T/R_J$, it seems to be a viable good diffusion barrier layer as indicated by the lowest $R_J A_J$. It is thus suggested to sandwich the Co—Fe—Hf sense layer between the Co—Fe/Co—Fe—B and Ni—Fe sense layers to suppress the Ni diffusion.

Figure 7:
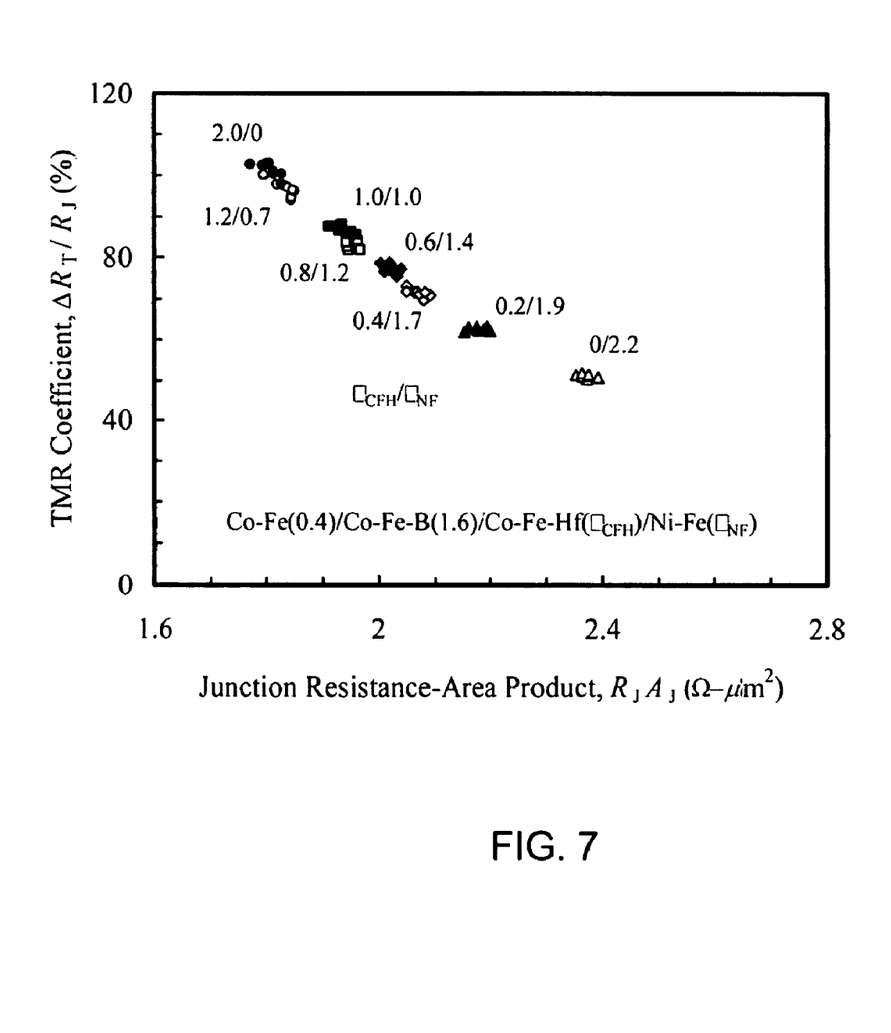
FIG. 7 is a chart showing $\Delta R_T/R_J$ versus $R_J A_J$ for non-patterned TMR read sensors with Co—Fe(0.4)/Co—Fe—B (1.6)/Co—Fe—Hf($\delta_{CFH}$)/Ni—Fe($\delta_{NF}$) sense layers after annealing for 5 hours at 240° C.

Indeed, the Co—Fe—Hf sense layer acts as a viable diffusion barrier layer for the Ni—Fe sense layer. FIG. 7 shows $\Delta R_T/R_J$ versus $R_J A_J$ for non-patterned TMR read sensors with Co—Fe(0.4)/Co—Fe—B(1.6)/Co—Fe—Hf($\delta_{CFH}$)/Ni—Fe($\delta_{NF}$) sense layers after annealing for 5 hours at 240° C. As the thickness of Co—Fe—Hf sense layer ($\delta_{CFH}$) increases and the thickness of Ni—Fe sense layer ($\delta_{NF}$) decreases for maintaining the designed magnetic moment of 0.32 memu/cm$^2$, $R_J A_J$ continues to decrease while $\Delta R_T/R_J$ continues to increase, indicating continuing improvements in suppressing the Ni diffusion.

Figure 8:
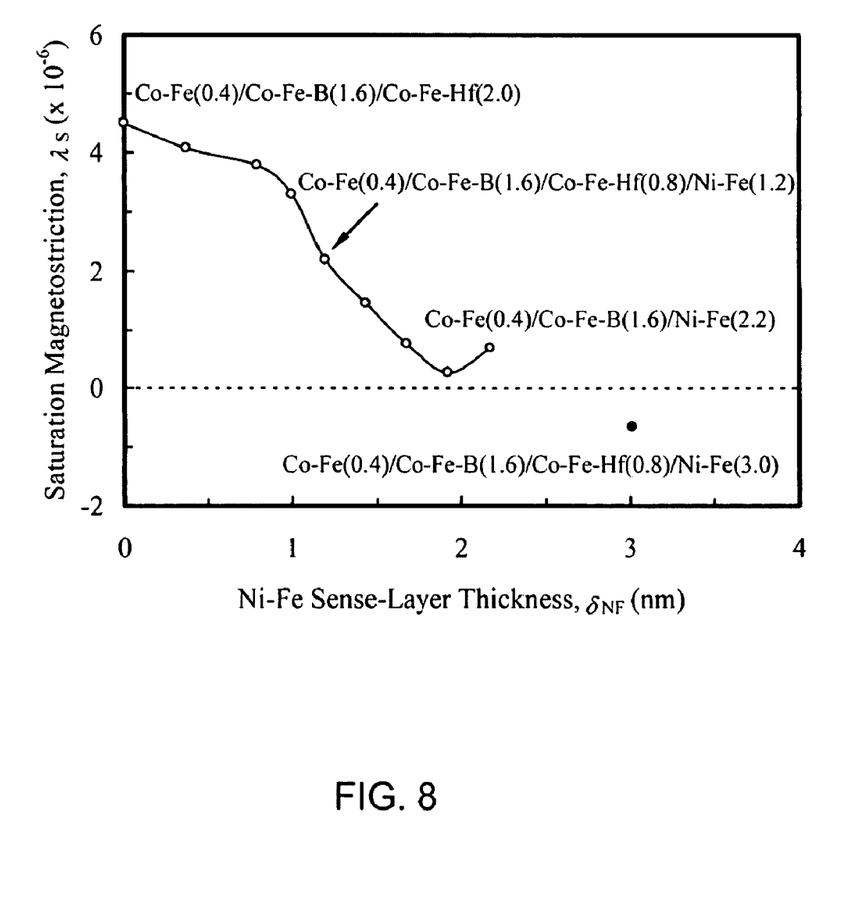
FIG. 8 is a chart showing a saturation magnetostriction ($\delta_S$) versus $\delta_{NF}$ for non-patterned TMR read sensors corresponding to those shown in FIG. 7.

FIG. 8 shows a saturation magnetostriction ($\delta_S$) versus $\delta_{NF}$ for non-patterned TMR read sensors corresponding to those shown in FIG. 7. As expected, $\delta_S$ decreases as $\delta_{NF}$ increases. It is suggested to use a 0.8 nm thick Co—Fe—Hf sense layer as an effective diffusion barrier layer for attaining a high $\Delta R_T/R_J$ and a low $\delta_S$. In order to meet the sensor design with a sense-layer magnetic moment of 0.32 memu/cm$^2$, it is challenging to minimize thicknesses of the Co—Fe, Co—Fe—B and Co—Fe—Hf sense layers with positive $\delta_S$'s for maximizing the thickness of the Ni—Fe sense layer with a negative $\delta_S$. If the sense-layer magnetic moment increases from 0.32 to 0.42 memu/cm$^2$ (equivalent to that of a 6.0 nm thick ferromagnetic 80Ni-20Fe film without moment losses at interfaces) and the thicknesses of the Co—Fe, Co—Fe—B and Co—Fe—Hf sense layers remain the same, the thickness of the Ni—Fe sense layer may increase from 1.2 to 3.0 nm. As a result, $\delta_S$ substantially decreases from 2.2 to $-0.7\times10^{-6}$, while $R_J A_J$ and $\Delta R_T/R_J$ remain nearly unchanged.

Figure 9:
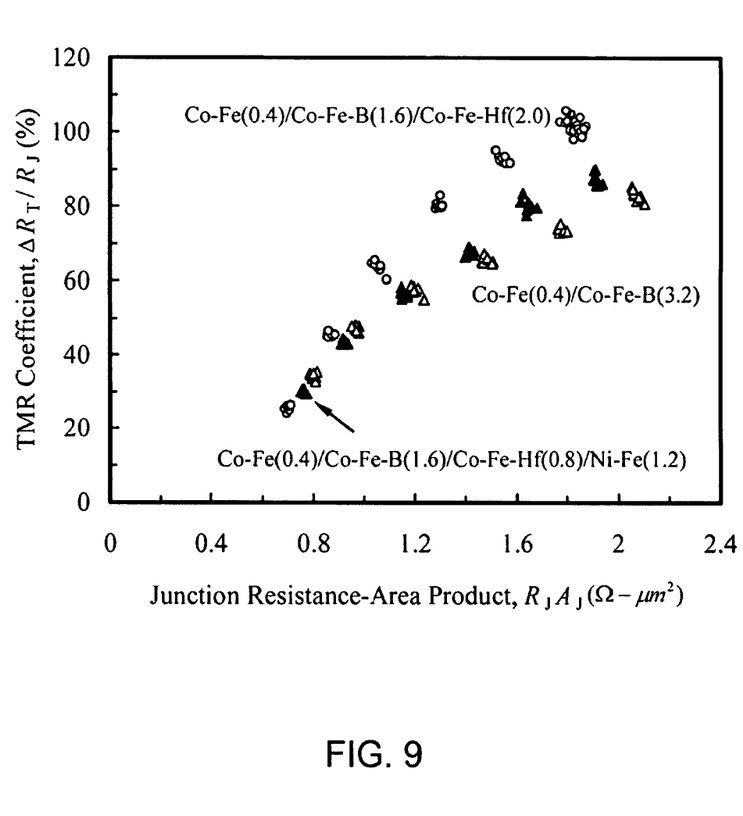
FIG. 9 is a chart showing $\Delta R_T/R_J$ versus $R_J A_J$ for non-patterned TMR read sensors with Co—Fe(0.4)/Co—Fe—B (3.2), Co—Fe(0.4)/Co—Fe—B(1.6)/Co—Fe—Hf(0.8)/Ni—Fe(1.2) and Co—Fe(0.4)/Co—Fe—B(1.6)/Co—Fe—Hf(2.0) sense layers after annealing for 5 hours at 240° C.

FIG. 9 shows $\Delta R_T/R_J$ versus $R_J A_J$ for non-patterned TMR read sensors with Co—Fe(0.4)/Co—Fe—B(3.2), Co—Fe (0.4)/Co—Fe—B(1.6)/Co—Fe—Hf(0.8)/Ni—Fe(1.2) and Co—Fe(0.4)/Co—Fe—B(1.6)/Co—Fe—Hf(2.0) sense layers after annealing for 5 hours at 240° C. As the Mg—O barrier-layer thickness decreases from 0.8 to ~0.6 nm, both $R_J A_J$ and $\Delta R_T/R_J$ decreases. Over an $R_J A_J$ range from 0.9 to 1.9 Ω-μm$^2$, the TMR read sensor with the Co—Fe/Co—Fe—B/Co—Fe—Hf sense layers exhibits the highest $\Delta R_T/R_J$. In addition, although the TMR read sensor with the Co—Fe/Co—Fe—B/Co—Fe—Hf/Ni—Fe sense layers exhibits a lower $\Delta R_T/R_J$, its sense layers exhibits a lower $\delta_S$.

Figure 10:
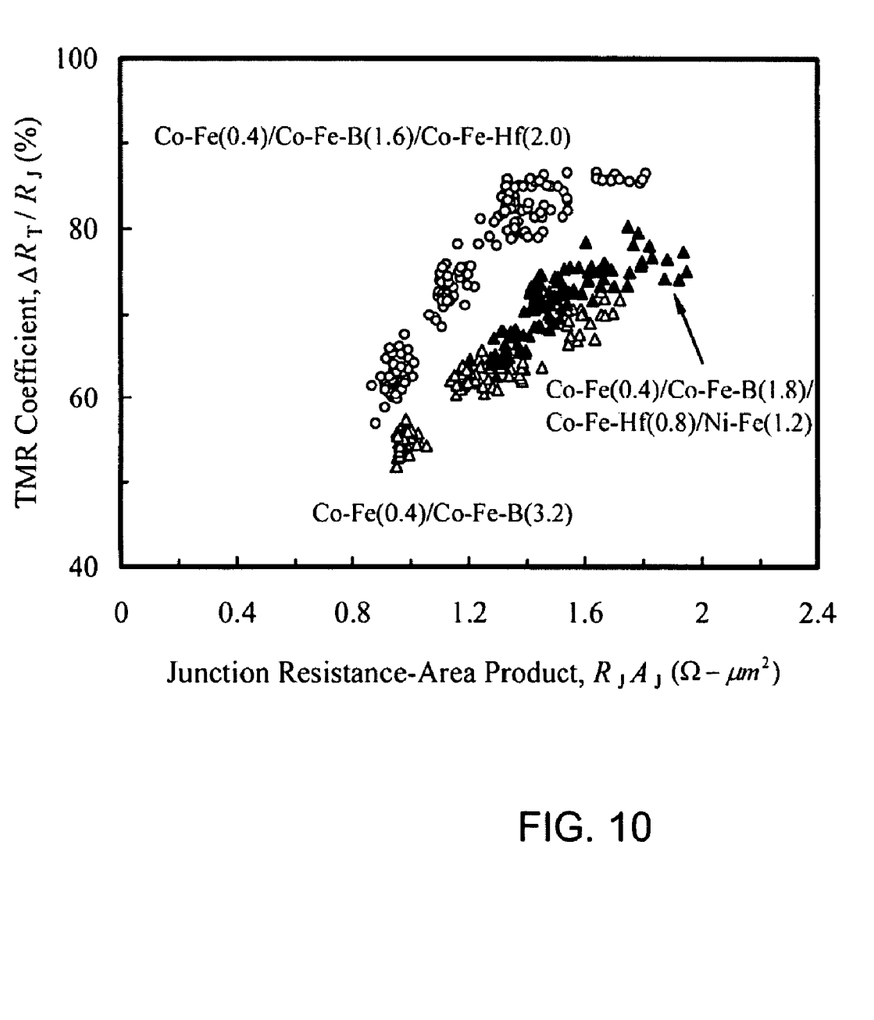
FIG. 10 is a chart showing $\Delta R_T/R_J$ versus $R_J A_J$ for patterned TMR read sensors with Co—Fe(0.4)/Co—Fe—B (3.2), Co—Fe(0.4)/Co—Fe—B(1.6)/Co—Fe—Hf(0.8)/Ni—Fe(1.2) and Co—Fe(0.4)/Co—Fe—B(1.6)/Co—Fe—Hf(2.0) sense layers after annealing for 5 hours at 240° C.

FIG. 10 shows $\Delta R_T/R_J$ versus $R_J A_J$ for patterned TMR read sensors with sense layers corresponding to those shown in FIG. 9. The TMR read sensors are patterned into round devices of 750 nm in diameter, and are probed with a four-point probe in a magnetic field of 2,000 Oe. Measured data and device areas are used in simple calculations to determine $R_J A_J$ and $\Delta R_T/R_J$. The device results as shown in FIG. 10 basically ensure the correctness of the modeled results as shown FIG. 9, and clearly indicate the advantage of the TMR read sensor with the Co—Fe/Co—Fe—B/Co—Fe—Hf sense layers over the $R_J A_J$ range from 0.9 to 1.9 Ω-μm$^2$. For example, at an $R_J A_J$ of as low as 0.9 Ω-μm$^2$, the TMR read sensor with the Co—Fe/Co—Fe—B/Co—Fe—Hf sense layers exhibit a $\Delta R_T/R_J$ of as high as 64%, corresponding a ratio of $\Delta R_T/R_J$ to $R_J A_J$ of as high as 73, indicate a very high TMR effect.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A current-perpendicular-to-plane (CPP) read sensor comprising
   nonmagnetic seed layers;
   an antiferromagnetic pinning layer on the nonmagnetic seed layers;
   a ferromagnetic keeper layer on the antiferromaunetic pinning layer;
   a nonmagnetic antiparallel-coupling layer on the ferromagnetic keeper layer;
   a ferromagnetic reference layer on the nonmagnetic antiparallel-coupling layer;
   a nonmagnetic barrier or spacer layer on the ferromagnetic reference layer;
   multiple ferromagnetic sense layers formed of polycrystalline and amorphous films on the nonmagnetic barrier or spacer layer; and
   a cap layer on the multiple ferromagnetic sense layers;
   wherein the multiple ferromagnetic sense layers further comprise:

a first sense layer formed by a ferromagnetic polycrystalline film;
a second sense layer formed by a ferromagnetic interstitial-type amorphous film on the first sense layer;
a third sense layer formed by a ferromagnetic substitute-type amorphous film on the second sense layer; and
a fourth sense layer formed by another ferromagnetic polycrystalline film on the third sense layer.

2. A CPP read sensor as in claim 1, wherein the first sense layer is formed by a Co—Fe film containing Co with a content ranging from 50 to 90 at % and Fe with a content ranging from 10 to 50 at %, and having a thickness not greater than 0.8 nm.

3. A CPP read sensor as in claim 1, wherein the second sense layer is formed by a Co—Fe—B film containing Co with a content ranging from 60 to 80 at %, Fe with a content ranging from 0 to 40 at %, and B with a content ranging from 4 to 30 at %, and having a thickness ranging from 1 to 4 nm.

4. A CPP read sensor as in claim 1, wherein the third sense layer is formed by a Co—Fe—X film (where X is Hf, Zr or Y) containing Co with a content ranging from 60 to 80 at %, Fe with a content ranging from 0 to 40 at %, and X with a content ranging from 4 to 30 at %, and having a thickness ranging from 0.6 to 2 nm.

5. A CPP read sensor as in claim 1, wherein the fourth sense layer is formed by a Ni—Fe film containing Ni with a content ranging from 80 to 100 at % and Fe with a content ranging from 0 to 20 at %, and having a thickness ranging from 1 to 8 nm.

6. A CPP read sensor as in claim 1 wherein the nonmagnetic layer formed on the ferromagnetic reference layer is a barrier layer formed by a nonmagnetic electrically insulating oxygen-doped Mg (Mg—O) or Mg oxide ($MgO_x$) film with a thickness ranging from 0.4 to 2 nm for detecting resistance changes through a tunneling magnetoresistance effect.

7. A CPP read sensor as in claim 1 wherein the nonmagnetic layer formed on the ferromagnetic reference layer is a spacer layer formed by a nonmagnetic electrically conducting Cu or oxygen-doped Cu (Cu—O) film with a thickness ranging from 1.6 to 4 nm for detecting resistance changes through a giant magnetoresistance effect.

8. A CPP read sensor as in claim 1, wherein:
the first sense layer is formed by a Co—Fe film containing Co with a content ranging from 50 to 90 at % and Fe with a content ranging from 10 to 50 at %, and having a thickness not greater than 0.8 nm;
the second sense layer is formed by a Co—Fe—B film containing Co with a content ranging from 60 to 80 at %, Fe with a content ranging from 0 to 40 at %, and B with a content ranging from 4 to 30 at %, and having a thickness ranging from 1 to 4 nm;
the third sense layer is formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.6 to 2 nm; and
the fourth sense layer is formed by a Ni—Fe film containing Ni with a content ranging from 80 to 100 at % and Fe with a content ranging from 0 to 20 at %, and having a thickness ranging from 1 to 8 nm.

9. A hard disk drive including
a hard disk; and
a read head that includes a current-perpendicular-to-plane (CPP) read sensor for reading data from the hard disk, the CPP read sensor comprising nonmagnetic seed layers;
an antiferromagnetic pinning layer on the nonmagnetic seed layers;
a ferromagnetic keeper layer on the antiferromaunetic pinning layer;
a nonmagneric antiparallel-coupling layer on the ferromagnetic keeper layer;
a ferromagnetic reference layer on the nonmagneric antiparallel-coupling layer;
a nonmagnetic barrier or spacer layer on the ferromagnetic reference layer;
multiple ferromagnetic sense layers formed of polycrystalline and amorphous films on the nonmagnetic barrier or spacer layer; and
a nonmagnetic cap layer on the multiple ferromagnetic sense layers;
wherein the multiple ferromagnetic sense layers further comprise:
a first sense layer formed by a ferromagnetic polycrystalline film;
a second sense layer formed by a ferromagnetic interstitial-type amorphous film on the first sense layer;
a third sense layer formed by a ferromagnetic substitute-type amorphous film on the second sense layer; and
a fourth sense layer formed by another ferromagnetic polycrystalline film on the third sense layer.

10. The hard disk drive of claim 9, wherein the first sense layer is formed by a Co—Fe film containing Co with a content ranging from 50 to 90 at % and Fe with a content ranging from 10 to 50 at %, and having a thickness not greater than 0.8 nm.

11. The hard disk drive of claim 9 wherein the second sense layer is formed by a Co—Fe—B film containing Co with a content ranging from 60 to 80 at %, Fe with a content ranging from 0 to 40 at %, and B with a content ranging from 4 to 30 at %, and having a thickness ranging from 1 to 4 nm.

12. The hard disk drive of claim 9, wherein the third sense layer is formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.6 to 2 nm.

13. The hard disk drive of claim 9, wherein the fourth sense layer is formed by a Ni—Fe film containing Ni with a content ranging from 80 to 100 at % and Fe with a content ranging from 0 to 20 at %, and having a thickness ranging from 1 to 8 nm.

14. The hard disk drive of claim 9, wherein the nonmagnetic layer formed on the ferromagnetic reference layer is a barrier layer formed of a nonmagnetic electrically insulating oxygen-doped Mg (Mg—O) or Mg oxide ($MgO_x$) film with a thickness ranging from 0.4 to 2 nm for detecting resistance changes through a tunneling magnetoresistance effect.

15. The hard disk drive of claim 9, wherein the nonmagnetic layer formed on the ferromagnetic reference layer is a spacer layer formed of a nonmagnetic electrically conducting Cu or oxygen-doped Cu (Cu—O) film with a thickness ranging from 1.6 to 4 nm for detecting resistance changes through a giant magnetoresistance effect.

16. A hard disk drive as in claim 9, wherein:
the first sense layer is formed by a Co—Fe film containing Co with a content ranging from 50 to 90 at % and Fe with a content ranging from 10 to 50 at %, and having a thickness not greater than 0.8 nm;
the second sense layer is formed by a Co—Fe—B film containing Co with a content ranging from 60 to 80 at %, Fe with a content ranging from 0 to 40 at %, and B with a content ranging from 4 to 30 at %, and having a thickness ranging from 1 to 4 nm;

the third sense layer is formed by a Co—Fe—X film (where X is Hf, Zr or Y) containing Co with a content ranging from 60 to 80 at %, Fe with a content ranging from 0 to 40 at %, and X with a content ranging from 6 to 30 at %, and having a thickness ranging from 0.6 to 2 nm; and the fourth sense layer is formed by a Ni—Fe film containing Ni with a content ranging from 80 to 100 at % and Fe with a content ranging from 0 to 20 at %, and having a thickness ranging from 1 to 8 nm.

* * * * *